United States Patent
Chen

(10) Patent No.: US 11,737,296 B2
(45) Date of Patent: Aug. 22, 2023

(54) OLED DISPLAY DEVICE, DISPLAY PANEL AND MANUFACTURING METHOD OF OLED DISPLAY DEVICE

(71) Applicant: BOE TECHNOLOGY GROUP CO., LTD., Beijing (CN)

(72) Inventor: Xueqin Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 304 days.

(21) Appl. No.: 16/767,859

(22) PCT Filed: Dec. 23, 2019

(86) PCT No.: PCT/CN2019/127349
§ 371 (c)(1),
(2) Date: May 28, 2020

(87) PCT Pub. No.: WO2020/143438
PCT Pub. Date: Jul. 16, 2020

(65) Prior Publication Data
US 2021/0249621 A1    Aug. 12, 2021

(30) Foreign Application Priority Data
Jan. 10, 2019 (CN) .......................... 201910023399.8

(51) Int. Cl.
*H01L 51/50* (2006.01)
*H10K 50/12* (2023.01)
(Continued)

(52) U.S. Cl.
CPC .......... *H10K 50/121* (2023.02); *H10K 71/00* (2023.02); *H10K 71/164* (2023.02); *H10K 50/12* (2023.02);
(Continued)

(58) Field of Classification Search
CPC . H01L 51/0085; H01L 51/0072; H01L 51/00; H01L 51/0054; H01L 51/0067;
(Continued)

(56) References Cited

U.S. PATENT DOCUMENTS 9,147,846 B2 * 9/2015 Kim ..................... C07D 401/14
2014/0054571 A1   2/2014 Yang et al.
(Continued)

FOREIGN PATENT DOCUMENTS

CN    1582073 A    2/2005
CN    1822409 A    8/2006
(Continued)

OTHER PUBLICATIONS

First office action dated Jan. 2, 2020 for application No. CN201910023399.8 with English translation attached.
(Continued)

*Primary Examiner* — Younes Boulghassoul
*Assistant Examiner* — Quinton A Brasfield
(74) *Attorney, Agent, or Firm* — Nath, Goldberg & Meyer; Joshua B. Goldberg

(57) ABSTRACT

The present disclosure provides an OLED display device, a display panel and a manufacturing method of the OLED display device, and belongs to the field of display technology. The OLED display device includes a light-emitting layer, a material of the light-emitting layer includes a host light-emitting material and a carrier balance material doped in the host light-emitting material; and the carrier balance material is used for balancing an electron mobility and a hole mobility of the light-emitting layer.

9 Claims, 1 Drawing Sheet

(51) Int. Cl.
  *H10K 71/00* (2023.01)
  *H10K 71/16* (2023.01)
  *H10K 85/60* (2023.01)
  *H10K 50/18* (2023.01)

(52) U.S. Cl.
  CPC ......... *H10K 50/181* (2023.02); *H10K 85/615* (2023.02); *H10K 85/622* (2023.02)

(58) Field of Classification Search
  CPC ............ H01L 51/0073; H01L 51/0074; H01L 51/006; H01L 51/0061; H10K 50/18; H10K 50/181; H10K 50/12
  See application file for complete search history.

(56) References Cited

U.S. PATENT DOCUMENTS

| | | | | |
|---|---|---|---|---|
| 2014/0073076 A1* | 3/2014 | D'Andrade | ............ | H10K 71/10 438/46 |
| 2016/0359117 A1* | 12/2016 | Hamade | .............. | H01L 51/0071 |
| 2018/0062085 A1* | 3/2018 | Bergmann | ............ | H10K 85/633 |
| 2019/0386234 A1* | 12/2019 | Cheng | .................... | H10K 50/17 |
| 2020/0044175 A1* | 2/2020 | Kotake | ................ | H10K 50/171 |

FOREIGN PATENT DOCUMENTS

| | | | |
|---|---|---|---|
| CN | 101118953 | A | 2/2008 |
| CN | 101404323 | A | 4/2009 |
| CN | 102651454 | A | 8/2012 |
| CN | 104078623 | A | 10/2014 |
| CN | 104377309 | A | 2/2015 |
| CN | 204257709 | U | 4/2015 |
| CN | 106252523 | A | 12/2016 |
| CN | 106654034 | A | 5/2017 |
| CN | 108807481 | A | 11/2018 |
| CN | 109004096 | A | 12/2018 |
| CN | 109585668 | A | 4/2019 |

OTHER PUBLICATIONS

Second office action dated Jul. 23, 2020 for application No. CN201910023399.8 with English translation attached.

\* cited by examiner

OLED DISPLAY DEVICE, DISPLAY PANEL AND MANUFACTURING METHOD OF OLED DISPLAY DEVICE

CROSS-REFERENCE TO RELATED APPLICATIONS

This is a National Phase Application filed under 35 U.S.C. 371 as a national stage of PCT/CN2019/127349, filed Dec. 23, 2019, an application claiming the benefit of Chinese Application No. 201910023399.8, filed Jan. 10, 2019, the content of each of which is hereby incorporated by reference in its entirety.

TECHNICAL FIELD

The present disclosure relates to the field of display technology, and particularly relates to an OLED display device, a display panel and a manufacturing method of the OLED display device.

BACKGROUND

An organic light-emitting diode (OLED) is a display device that has characteristics of self-luminescence, wide viewing angle, fast response, wide color gamut, high definition and contrast, capability of realizing flexible display and so on. Therefore, an OLED display panel has strong competitiveness in display panels of a new generation, and is recognized as the display panel having the most development potential by industry.

SUMMARY

The present disclosure is directed to at least one of technical problems of the prior art, and provides an OLED display device with high light-emitting efficiency.

A technical solution adopted for solving the technical problem is an OLED display device including a light-emitting layer, wherein a material of the light-emitting layer includes a host light-emitting material and a carrier balance material doped in the host light-emitting material; and the carrier balance material is used for balancing an electron mobility and a hole mobility of the light-emitting layer.

In some implementations, the carrier balance material is uniformly doped in the host light-emitting material.

In some implementations, a doping concentration of the carrier balance material in the host light-emitting material is gradually changed in a thickness direction of the light-emitting layer.

In some implementations, the host light-emitting material has an electron mobility greater than a hole mobility; the carrier balance material includes a hole transport material and/or an electron blocking material.

In some implementations, the host luminescent material is a blue organic light-emitting material.

In some implementations, the material of the light-emitting layer further includes a dopant, a material of the dopant includes at least one of a fluorene derivative and a pyrene derivative.

In some implementations, the carrier balance material accounts for 0.1%-50% of the material of the light-emitting layer.

In some implementations, the OLED display device further includes: a base substrate, and an anode, a hole transport layer, an electron blocking layer, a hole blocking layer, an electron transport layer and a cathode which are sequentially arranged along a direction departing from the base substrate, wherein the light-emitting layer is disposed between the electron blocking layer and the hole blocking layer.

A technical solution adopted for solving the technical problem is a display panel which includes the above OLED display device.

A technical solution adopted for solving the technical problem is a manufacturing method of an OLED display device, including forming a light-emitting layer, which further includes: simultaneously evaporating a host light-emitting material and a carrier balance material by an evaporation process to form a light-emitting layer, wherein the carrier balance material is used for balancing an electron mobility and a hole mobility of the light-emitting layer.

In some implementations, an evaporation rate of the host light-emitting material is kept constant, and an evaporation rate of the carrier balance material is kept constant; or, the evaporation rate of the host light-emitting material is kept constant, and the evaporation rate of the carrier balance material is gradually changed.

Reference signs: L anode; 2. hole transport layer; 3. electron blocking layer; 4. light-emitting layer; 5. hole blocking layer; 6. electron transport layer; 7. cathode.

DESCRIPTION OF EMBODIMENTS

In order to make those skilled in the art better understand the technical solutions of the present disclosure, the present disclosure is further described in detail with reference to the accompanying drawings and the detailed embodiments below.

Each of pixel units of an OLED display panel generally includes a red sub-pixel, a green sub-pixel and a blue sub-pixel, and an OLED display device of each sub-pixel generally includes an anode, a hole transport layer, an electron blocking layer, a light-emitting layer, a hole blocking layer, an electron transport layer, a cathode and so on. In the OLED display panel on the market at present, a blue light-emitting material used in an exciton recombination region of the blue sub-pixel is a fluorescent material, and due to characteristics of molecular structures in the light-emitting layer of the blue sub-pixel, the light-emitting layer of the blue sub-pixel has a host light-emitting material with an electron mobility higher than a hole mobility thereof, and thus when holes and electrons are recombined in the light-emitting layer, the exciton recombination region may be biased to an interface between the electron blocking layer and the light-emitting layer, the closer a position distant from the hole blocking layer, the lower a concentration of excitons at the position is, and since the exciton recombination region is deviated from a central position of the light-emitting layer, a relative low light-emitting efficiency of the OLED display device of the blue sub-pixel (i.e., blue OLED display device) is resulted in.

First Embodiment

Figure 1:
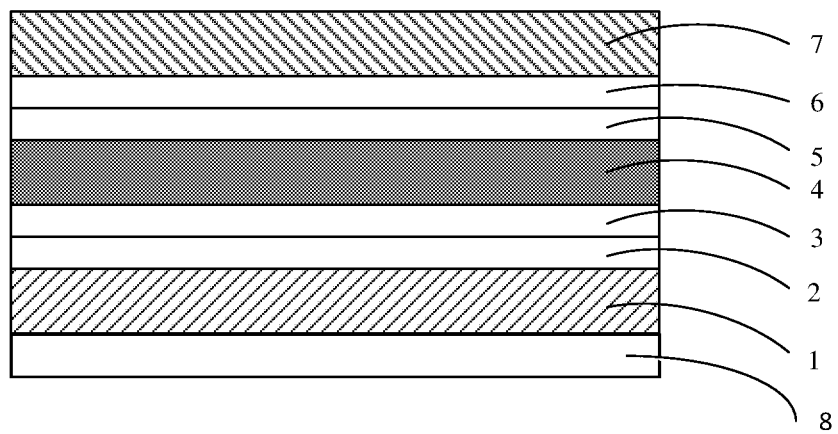
FIG. 1 is a schematic structural diagram of an OLED display device in an embodiment of the present disclosure.

As shown in FIG. 1, the present embodiment provides an OLED display device including an anode 1, a cathode 7, and a light-emitting layer 4 interposed between the anode 1 and the cathode 7. A material of the light-emitting layer 4 includes a host light-emitting material and a carrier balance material doped in the host light-emitting material; the carrier balance material is used to balance the electron mobility and the hole mobility of the light-emitting layer 4.

In the present embodiment, the balancing the electron mobility and the hole mobility of the light-emitting layer 4 means that a difference between the electron mobility and the hole mobility of the light-emitting layer 4 is ensured to be within a predetermined range. The predetermined range may be set and adjusted according to actual requirements.

A light-emitting principle of the OLED display device is as follows: under an action of an applied electric field, electrons and holes migrate from the cathode 7 and the anode 1, respectively, into the light-emitting layer 4. The electrons and the holes meet in the light-emitting layer 4 and recombine to form excitons which excite light-emitting molecules in the host light-emitting material, the light-emitting molecules emit visible light upon being irradiated. It follows that a light-emitting efficiency of the OLED display device is directly related to a concentration of the excitons in the light-emitting layer 4. In the related art, since the electron mobility and the hole mobility of the host light-emitting material are generally very different from each other, a difference between a concentration of electrons and a concentration of holes in the light-emitting layer 4 is relative large, resulting in a relative low exciton recombination efficiency, and thereby resulting in a relative low light-emitting efficiency of the OLED display device.

In the present embodiment, the carrier balance material is doped in the host light-emitting material, so that the carrier balance material is distributed in the entire light-emitting layer 4, and thus the carrier balance material is used to balance the electron mobility and the hole mobility of the entire light-emitting layer 4, and further balance the concentration of electrons and the concentration of holes in the light-emitting layer 4, thereby improving the light-emitting efficiency of the OLED display device.

When the electron mobility of the host light-emitting material of the light-emitting layer 4 is greater than the hole mobility of the host light-emitting material of the light-emitting layer 4, specifically, the carrier balance material may be an electron blocking material or a hole transport material; when the hole mobility of the host light-emitting material of the light-emitting layer 4 is larger than the electron mobility of the host light-emitting material of the light-emitting layer 4, specifically, the carrier balance material may be a hole blocking material or an electron transport material, Both the hole transport material and the electron blocking material can improve the hole mobility of the light-emitting layer 4, and in the related art, both the hole transport material and the electron blocking material are usually used in the OLED display device, and thus both the hole transport material and the electron blocking material can be directly used for manufacturing the OLED display device, and there is no need to research and develop new materials, so that a cost for research and development is saved.

The present embodiment is described by taking the carrier balance material being the electron blocking material as an example. Meanwhile, host light-emitting materials of OLED display devices with different colors are different from each other, and electron mobilities and hole mobilities of different host light-emitting materials are different from each other. In order to more clearly and specifically explain the present embodiment, the following description will be made by taking an example in which the host light-emitting material is a blue organic light-emitting material.

A structure of a blue OLED display device includes an anode 1, a light-emitting layer 4, and a cathode 7, the material of the light-emitting layer 4 includes a blue organic light-emitting material, an electron blocking material (i.e., carrier balance material), and a dopant.

Figure 2:
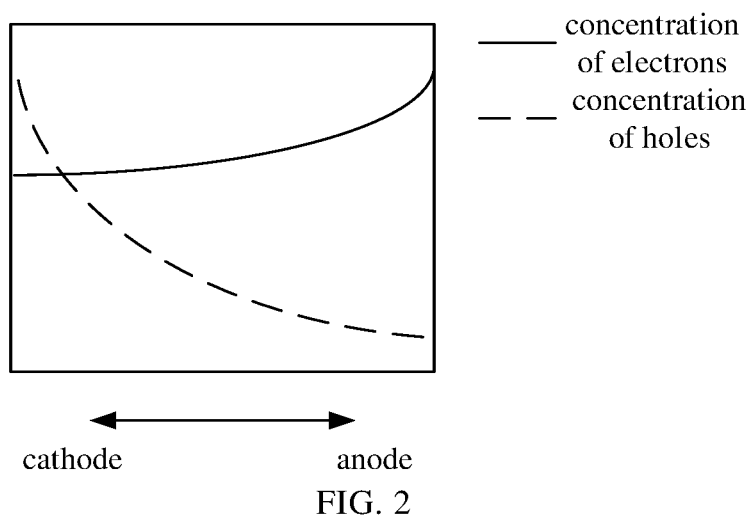
FIG. 2 is a graph showing distributions of concentrations of carriers in a light-emitting layer according to an embodiment of the present disclosure.

The electron mobility of the blue organic light-emitting material is higher than the hole mobility of the blue organic light-emitting material due to characteristics of molecular structures of the blue organic light-emitting material, Distributions of the concentration of electrons and the concentration of holes in the light-emitting layer 4 during an operation of the OLED display device are shown in FIG. 2, Since the electron mobility of the blue organic light-emitting material is relative high, the concentration of electrons in the light-emitting layer 4 is relative uniform and relative high, and the hole mobility of the blue organic light-emitting material is relative low, a difference between concentrations of holes at different positions in the light-emitting layer 4 is relative large, and the concentration of holes at a position close to the anode 1 is much higher than that at a position close to the cathode 7. That is, in the light-emitting layer 4 of the blue OLED display device in the related art, the concentration of holes is non-uniform, which results in a low recombination efficiency and a low light-emitting efficiency of the OLED display device. In the present embodiment, since the material of the light-emitting layer 4 is doped with the electron blocking material which can increase the hole mobility in the light-emitting layer 4, the concentration of holes in the light-emitting layer 4 can be increased, the holes and the electrons in the light-emitting layer 4 tend to be balanced, and the light-emitting efficiency of the OLED display device is improved.

The blue organic light-emitting material may specifically include: n-type conjugated oligomeric quinoline derivatives (BIPPQ, B2PPQ, BtBPQ and BDBPQ); units such as pyrazine, imidazole, indolizine and phosphine oxide and the like for designing electron-type blue fluorescent materials, such as SE-EPY, TP-EPY, PA-EPY and NA-EPY; phenanthro-imidazole blue fluorescent material (BPPI-1); new electron-transport fluorescent material BPPI-2 prepared by indolizine units; and materials with triphenyl phosphine oxide and anthracene as core materials. The electron blocking material may specifically include: aromatic amine organic materials, such as TAPC, NPB, TPD, DPFL-NPB and spiro-TAD with Spiro structure; triphenylamine material2-TNATA and p-DPA-TDABd with star structure, or the like.

A material of the dopant may include: a fluorene derivative, a pyrene derivative, such as TBP.

In some implementations, the electron blocking material accounts for 0.1% to 50% of the material of the light-emitting layer 4. That is, a proportion of the carrier balance material in the light-emitting layer 4 ranges from 0.1% to 50%, and a specific value of the proportion may be set according to practical situations, which is not limited herein.

In the OLED display device in the present embodiment, a doping concentration of the carrier balance material may be implemented in the following first manner and second manner.

The first manner is to uniformly dope the carrier balance material into the host light-emitting material.

That is, the carrier balance material is uniformly distributed in the light-emitting layer 4, so that the hole mobility at each position of the light-emitting layer 4 is increased, the concentration of holes at each position in the light-emitting layer 4 is increased, thereby the difference between the concentration of holes and the concentration of electrons in the light-emitting layer 4 is reduced, and the light-emitting efficiency of the OLED display device is improved.

The second manner is to dope the carrier balance material into the host light-emitting material such that the doping concentration of the carrier balance material in the host light-emitting material is gradually changed in a thickness direction (an up-down direction in FIG. 4) of the light-emitting layer 4.

The distributions of the concentration of electrons and the concentration of holes in the light-emitting layer 4 during the operation of the OLED display device are shown in FIG. 2. Since the electron mobility of the blue organic light-emitting material is relative high, the concentration of electrons in the light-emitting layer 4 is relatively uniform and relatively high; the hole mobility of the blue organic light-emitting material is relative low, the difference between the concentrations of holes at different positions in the light-emitting layer 4 is relative large, and the concentration of holes at the position close to the anode 1 is much higher than that at the position close to the cathode 7. That is, in the light-emitting layer 4 of the blue OLED display device in the related art, the closer the position distant from the anode 1, the larger the concentration of excitons is, and thus, the exciton recombination region of the light-emitting layer 4 is not located at a center of the light-emitting layer 4 but is biased to the anode 1, which may affect a service life of the OLED display device.

In the present embodiment, the doping concentration of the carrier balance material in the light-emitting layer 4 is changed, so that the doping concentration of the carrier balance material in the host light-emitting material is gradually changed in the thickness direction of the light-emitting layer 4, and therefore, carriers in the host light-emitting material are balanced and distributed uniformly, and the exciton recombination region is distributed in the entire light-emitting layer 4, the light-emitting efficiency of the OLED display device is improved, and the service life of the OLED display device is prolonged.

Specifically, the doping concentration of the carrier balance material may be increased or decreased in the thickness direction of the light-emitting layer 4 with respect to material characteristics of the host light-emitting material. In some implementations, in a case where the host light-emitting material is the blue organic light-emitting material, the doping concentration of the carrier balance material in the host light-emitting material is gradually increased in the thickness direction of the light-emitting layer 4 and in a direction from the anode 1 to the cathode 7 in the OLED display device. Therefore, an improvement degree of the carrier balance material to the hole mobility of the light-emitting layer 4 is gradually enhanced from a position close to the electron blocking layer 3 to a position close to the hole blocking layer 5 in the light-emitting layer 4, in combination with the characteristics of the blue organic light-emitting material (the concentration of holes close to the electron blocking layer 3 is much greater than the concentration of holes close to the hole blocking layer 5), so that the difference between hole mobilities at positions in the light-emitting layer 4 is small and the concentration of holes is relative uniform, thereby the excitons are relative uniformly distributed in the light-emitting layer, that is, the exciton recombination region is distributed in the entire light-emitting layer 4, thereby the service life of the OLED display device can be prolonged and the light-emitting efficiency of the OLED display device is improved. Certainly, when the host light-emitting material is the blue organic light-emitting material, the doping concentration of the carrier balance material may be gradually decreased in the thickness direction of the light-emitting layer 4, and the hole mobility of the light-emitting layer 4 can still be enhanced to some extent.

It should be noted that, in a case where the OLED display device is a display device of another color, a selection of material and a distribution of concentration of the carrier balance material may be adjusted according to characteristics of the host light-emitting material.

It should be understood that the OLED display device of the present embodiment may further include a hole injection layer, a hole transport layer 2, and an electron blocking layer 3 disposed between the anode 1 and the light-emitting layer 4, and an electron injection layer, an electron blocking layer 6, and a hole blocking layer 5 disposed between the cathode 7 and the light-emitting layer 4, in addition to the anode 1, the light-emitting layer 4, and the cathode 7.

The material of the hole blocking layer 5 may include an electron transport material such as oxadiazine derivative and dendrimer thereof; metal chelate, nitrogen-containing five-membered heterocycle, triazine compound, thiadiazo compound, quinoline compound, phenanthroline compound; or may be an electron transport material containing nitrogen-containing six-membered heterocycle, cyano compound, organic boron compound, organosilicon compound, such as BCP, Bphen, TPBi, Alq3, Liq, NBphen, TAZ, Be (PP)2, OXD-7, TmPyPB, mLiq and the like.

In a case where the OLED display device includes the electron blocking layer 3, the carrier balance material may be an electron blocking material the same as that of the electron blocking layer 3. By using the electron blocking material as the carrier balance material in the light-emitting layer 4, the carrier balance material can be directly evaporated after the electron blocking layer 3 is evaporated on a substrate without replacing an evaporation equipment. Meanwhile, as the material of the carrier balance material is the same as that of the electron blocking layer 3, an interface potential barrier between the light-emitting layer 4 and the electron blocking layer 3 can be effectively improved, and an injection of holes into the light-emitting layer 4 is facilitated, so that the light-emitting efficiency of the OLED display device is improved.

Second Embodiment

The present embodiment provides a manufacturing method of an OLED display device, which can be used to manufacture the OLED display device provided in the first embodiment. The manufacturing method may include the following steps S11 through S13.

In step S11, forming an anode of the OLED display device on a base substrate 8.

Specifically, in this step, an anode conductive film may be formed by a sputtering process, and a pattern including the anode may be formed by a patterning process. The anode may be made of inorganic metal oxide (such as indium tin oxide (ITO), zinc oxide (ZnO), etc.), organic conductive polymer (such as poly 3,4-ethylenedioxythiophene/polystyrene sulfonate PEDOT: PSS, polyaniline PANI, etc.), or high work function metal material (such as gold, copper, silver, platinum, etc.).

In some implementations, after the anode is formed, a step of forming a structure of a hole injection layer and an electron blocking layer by an evaporation process may be further included.

In step S12, forming a light-emitting layer 4 of the OLED display device on the base substrate 8.

The material of the light-emitting layer 4 includes a host light-emitting material and a carrier balance material. In this step, the host light-emitting material and the carrier balance material may be simultaneously evaporated by an evaporation process to form the light-emitting layer 4. Specifically, the light-emitting layer 4 in which the carrier balance material is doped in the host light-emitting material may be formed on the base substrate 8 through simultaneously performing evaporation by two evaporation sources respectively containing the host light-emitting material and the carrier balance material.

A proportion of the carrier balance material to the host light-emitting material in the light-emitting layer 4 may be controlled by controlling evaporation rates of the two evaporation sources. Specifically, when the OLED display device provided in the first embodiment is manufactured in the first manner, the evaporation rates of the host light-emitting material and the carrier balance material may be kept constant, so that the light-emitting layer 4 uniformly doped with the carrier balance material is formed on the base substrate 8. When the OLED display, device provided in the first embodiment is manufactured in the second manner, the evaporation rate of the host light-emitting material may be kept constant, and the evaporation rate of the carrier balance material is gradually changed (specifically, gradually decreased in the present embodiment), so that the light-emitting layer 4 in which the doping concentration of the carrier balance material is gradually changed is formed on the base substrate 8.

In step S13, forming a cathode of the OLED display device on the base substrate 8 on which the light-emitting layer 4 has been formed.

Specifically, the cathode may be formed through a vacuum evaporation process. The material of the cathode may adopt a low work function metal material, such as lithium, magnesium, calcium, strontium, aluminum, indium, and the like or an alloy of any above metal(s) with copper, gold, silver, etc., or the cathode may be made of a very thin buffer insulating layer (such as lithium fluoride (LiF), cesium carbonate (CsCO3), etc.) and any above metal(s) or alloy.

In some implementations, after the light-emitting layer 4 is formed and before the cathode is formed, a step of forming a hole blocking layer, an electron transport layer, and the like may be further included, which will not be described in detail herein.

Third Embodiment

The present embodiment provides a display panel including the OLED display device provided in the first embodiment.

Specifically, the display panel may be applied to any product or component with a display function, such as a mobile phone, a tablet computer, a television, a display, a notebook computer, an advertisement screen and the like.

In the display panel of the present embodiment, the carrier balance material is doped into the host light-emitting material of the OLED display device, so that the carrier balance material is distributed in the entire light-emitting layer 4, and thus the concentration of electrons and the concentration of holes of the entire light-emitting layer 4 are balanced by the carrier balance material, and the light-emitting efficiency of the OLED display device, that is, the display efficiency of the display panel, is improved.

In some implementations, when the display panel includes the OLED display device provided in first embodiment and formed in the above first manner, the display efficiency of the display panel may be improved, and the service life of the OLED display device, that is, the service life of the display panel, may be prolonged.

It should be understood that the above embodiments are merely exemplary, embodiments adopted to illustrate the principle of the present disclosure, and the present disclosure is not limited thereto. It will be apparent to those skilled in the art that various modifications and improvements may be made without departing from the spirit and scope of the present disclosure, and such modifications and improvements are considered to be within the scope of the present disclosure.

The invention claimed is:

1. An OLED display device, comprising: a base substrate, and an anode, a hole transport layer, an electron blocking layer, a light-emitting layer, a hole blocking layer, an electron transport layer and a cathode which are sequentially arranged along a direction departing from the base substrate,
   wherein a material of the light-emitting layer comprises a host light-emitting material and a carrier balance material doped in the host light-emitting material; and
   the carrier balance material is used for balancing an electron mobility and a hole mobility of the light-emitting layer, and wherein
   the host light-emitting material is a blue organic light-emitting material;
   a doping concentration of the carrier balance material in the host light-emitting material is gradually changed in a thickness direction of the light-emitting layer; and
   the carrier balance material comprises an electron blocking material.

2. The OLED display device of claim 1, wherein the host light emitting material has an electron mobility greater than a hole mobility thereof.

3. A display panel, comprising the OLED display device of claim 2.

4. The OLED display device of claim 1, wherein the material of the light-emitting layer further comprises a dopant, a material of the dopant comprises at least one of a fluorene derivative and a pyrene derivative.

5. A display panel, comprising the OLED display device of claim 4.

6. The OLED display device of claim 1, wherein the carrier balance material accounts for 0.1%-50% of the material of the light-emitting layer.

7. A display panel, comprising the OLED display device of claim 6.

8. A display panel, comprising the OLED display device of claim 1.

9. A manufacturing method of an OLED display device, comprising:
   sequentially forming an anode, a hole transport layer, an electron blocking layer, a light-emitting layer, a hole blocking layer, an electron transport layer and a cathode on a base substrate along a direction departing from the base substrate, wherein
   forming the light-emitting layer comprises:
      simultaneously evaporating a host light-emitting material and a carrier balance material by an evaporation process to form the light-emitting layer, wherein the carrier balance material is used for balancing an electron mobility and a hole mobility of the light-emitting layer, wherein an evaporation rate of the host light-emitting material is kept constant, and the evaporation rate of the carrier balance material is gradually changed, so that a doping concentration of the carrier balance material in the host light-emitting material is gradually changed in a thickness direction of the light-emitting layer, and wherein the host light-emitting material is a blue organic light-emitting material; and the carrier balance material comprises an electron blocking material.

* * * * *